(12) United States Patent
Prasad

(10) Patent No.: US 6,198,733 B1
(45) Date of Patent: Mar. 6, 2001

(54) FORWARD-LINK SYNC-CHANNEL INTERLEAVING/DE-INTERLEAVING FOR COMMUNICATION SYSTEMS BASED ON CLOSED-FORM EXPRESSIONS

(75) Inventor: Mohit K. Prasad, Bethlehem, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/039,154

(22) Filed: Mar. 13, 1998

(51) Int. Cl.$^7$ ........................................ H04J 13/00
(52) U.S. Cl. .................. 370/342; 370/320; 370/441; 370/479; 375/140; 375/295; 375/316
(58) Field of Search ................................ 370/210, 342, 370/350, 441, 487, 503, 320, 479; 375/140, 142, 143, 145, 149, 150, 152, 262, 295, 372, 316

(56) References Cited

U.S. PATENT DOCUMENTS

| | | | |
|---|---|---|---|
| 4,199,660 | * 4/1980 | Dill et al. ............................. | 370/210 |
| 4,742,517 | 5/1988 | Takagi et al. ......................... | 371/2 |
| 5,418,813 | * 5/1995 | Schaffner et al. ................... | 370/441 |
| 5,673,291 | * 9/1997 | Dent ..................................... | 375/262 |
| 5,675,344 | 10/1997 | Tong et al. .......................... | 342/457 |
| 5,812,543 | * 9/1998 | Sugita .................................. | 370/441 |
| 5,946,356 | * 8/1999 | Felix et al. .......................... | 375/295 |
| 5,949,796 | * 9/1999 | Kumar ................................. | 370/487 |
| 6,005,855 | * 12/1999 | Zehavi et al. ....................... | 370/342 |
| 6,064,664 | 5/2000 | Kim ..................................... | 370/335 |

OTHER PUBLICATIONS

"Realization of Optimum Interleavers", by John Ramsey, IEEE Transactions on Information Theory, vol. IT–16, No.3, May 1970, pp. 337–345.

* cited by examiner

Primary Examiner—Douglas W. Olms
Assistant Examiner—Shick Hom
(74) Attorney, Agent, or Firm—Steve Mendelsohn

(57) ABSTRACT

Interleaving and de-interleaving of forward-link Sync channels is performed by implementing closed-form expressions that are equivalent to the table-based processing specified in the cdmaOne telecommunication specification. The implementation can be in either hardware or software or a combination of both. For Sync-channel interleaving, the closed-form expression relates each un-interleaved symbol position to a corresponding interleaved symbol position, which is used to generate an interleaved symbol stream from the un-interleaved symbol stream. For Sync-channel de-interleaving, the closed-form expression relates each interleaved symbol position to a corresponding de-interleaved symbol position, which is used to generate a de-interleaved symbol stream from the interleaved symbol stream. In one hardware implementation, the forward-link interleaver/de-interleaver of the present invention has an address generation unit made from a modulo counter and a bit reversal unit.

21 Claims, 2 Drawing Sheets

FORWARD-LINK SYNC-CHANNEL INTERLEAVING/DE-INTERLEAVING FOR COMMUNICATION SYSTEMS BASED ON CLOSED-FORM EXPRESSIONS

CROSS-REFERENCES TO RELATED APPLICATIONS

This application is one of the following five U.S. patent applications filed on the same date: Ser. No. 09/039,151 Ser. No. 09/042,397 Ser. No. 09/089,157, Ser. No. 09/039,158, and Ser. No. 09/039,154 the teachings of all of which are incorporated herein by reference.

BACKGROUND OF THE INVENTION

1. Field of the Invention

The present invention relates to telecommunication systems conforming to the cdmaOne standard.

2. Description of the Related Art

The cdmaOne™ communication standard is an interim standard for mobile telecommunication systems in which communications to and from each mobile unit are supported by one of a set of base stations strategically located over the system coverage area. The cdmaOne standard specifies a common air interface for code division multiple access (CDMA) systems on the cellular (900 MHz) and the PCS (1900 MHz) bands for mobile telephony. In addition, the same air interface is used for different wireless loop equipment supplied by a significant number of manufacturers. The term "cdmaOne" is used to refer collectively to the IS-95, IS-95A, and IS-95B family of communication standards.

The cdmaOne standard specifies that the symbols encoded in both the forward-link signal transmitted from the base station to the mobile unit and the reverse-link signal transmitted from the mobile unit to the base station be interleaved in the signal stream. Interleaving is performed to make burst errors during transmission look like random errors that are separated from one another in the de-interleaved symbol stream. In that case, the decoder in a receiver can perform error correction to reconstruct the original symbol stream notwithstanding the presence of burst errors.

According to the cdmaOne standard, a base station transmits forward-link data on a Pilot channel (used for timing acquisition), a Sync channel (used for synchronization) at 4800 bps, Paging channels at either 9600 or 4800 bps, and four Traffic (or Fundamental) channels at 9600, 4800, 2400, and 1200 bps. Each frame in a forward-link Sync channel is 26.67 ms in duration and contains 64 different symbols. Each symbol is repeated so that 128 symbols are transmitted per frame at 4800 symbols per second. The data rates of 9600, 4800, 2400, and 1200 bps correspond to the set of four unpunctured rates under the cdmaOne standard referred to as Rate Set 1.

The cdmaOne standard also supports a second set of data rates referred to as Rate Set 2. In Rate Set 2, punctured convolutional codes are used to transmit data at 14400, 7200, 3600, and 1800 bps, corresponding to the unpunctured rates of 9600, 4800, 2400, and 1200 bps, respectively. By using punctured convolutional codes, the number of symbols per frame is maintained, and the interleaving structure for the four rates of Rate Set 2 is the same as the interleaving structure for the four rates of Rate Set 1.

Since only null data is sent on the Pilot channel, no interleaving is used on this channel. However, the cdmaOne specification does require interleaving for the rest of the forward-link channels.

For example, the cdmaOne standard specifies the forward-link interleaving process at the base station for the Sync channel by means of a table. FIG. 1A shows the order in which the 64 different symbols of each frame of un-interleaved forward-link Sync data may be sequentially (or linearly) arranged within a matrix of 16 rows and 8 columns in the base station. The symbols are written columnwise, beginning with the first column on the left, successively from the top row to the bottom row.

FIG. 1B shows the order in which the 64 different symbols stored in the matrix of FIG. 1A are to be read in order to form a frame of interleaved forward-link Sync data. The sequence of symbols in FIG. 1B are listed columnwise, beginning with the first column on the left, successively from the top row to the bottom row. Thus, the symbol #1 in FIG. 1A is the first symbol in an interleaved frame, followed by the symbol #33, followed by the symbol #17, etc.

The de-interleaving process at the mobile unit must perform the reverse of these operations to recover a de-interleaved symbol stream for subsequent processing. Although the cdmaOne standard does not specify the de-interleaving process, typical existing telecommunication systems implement the reverse-link de-interleaving process by an algorithmic deconstruction of the interleaving process. As such, both the interleaving process in a base station and the de-interleaving process in a mobile unit can be implemented at a reasonable cost only in software.

SUMMARY OF THE INVENTION

The present invention is directed to an interleaving process for cdmaOne base stations in which the forward-link un-interleaved Sync symbol stream is interleaved by hardware and/or software that implements closed-form expressions corresponding to the table-based procedures specified in the cdmaOne standard.

According to one embodiment, a closed-form expression relating each un-interleaved symbol position in an un-interleaved symbol stream to a corresponding interleaved symbol position is used to generate an interleaved symbol position for each symbol in the un-interleaved symbol stream. An interleaved symbol stream is generated from the un-interleaved symbol stream using the interleaved symbol positions.

In one hardware implementation, the present invention is an integrated circuit having an interleaver for interleaving a forward-link Sync channel of a cdmaOne communication system. The interleaver comprises a symbol buffer and an address generation unit. The address generation unit is adapted to generate symbol addresses for reading un-interleaved symbols from or writing interleaved symbols to the symbol buffer. For the un-interleaved Sync channel, the address generation unit implements a closed-form expression relating each un-interleaved symbol position to a corresponding interleaved symbol position to generate an interleaved symbol position for each symbol in the uninterleaved symbol stream.

The present invention is also directed to a de-interleaving process for cdmaOne mobile units in which the forward-link interleaved Sync symbol stream is de-interleaved by hardware and/or software that implements closed-form expressions corresponding to the table-based procedures specified in the cdmaOne standard.

According to one embodiment, a closed-form expression relating each interleaved symbol position in an interleaved symbol stream to a corresponding de-interleaved symbol position is used to generate a de-interleaved symbol position for each symbol in the interleaved symbol stream. A de-interleaved symbol stream is generated from the interleaved symbol stream using the de-interleaved symbol positions.

In one hardware implementation, the present invention is an integrated circuit having a de-interleaver for de-interleaving a forward-link Sync channel of a cdmaOne communication system. The de-interleaver comprises a symbol buffer and an address generation unit. The address generation unit is adapted to generate symbol addresses for reading interleaved symbols from or writing de-interleaved symbols to the symbol buffer. For the interleaved Sync channel, the address generation unit implements a closed-form expression relating each interleaved symbol position to a corresponding de-interleaved symbol position to generate a de-interleaved symbol position for each symbol in the interleaved symbol stream.

In preferred implementations of the present invention, the Sync-channel interleaver in a cdmaOne base station has the same design as the Sync-channel de-interleaver in a cdmaOne mobile unit. The implementation context dictates whether the device is used for interleaving or de-interleaving.

BRIEF DESCRIPTION OF THE DRAWINGS

Other aspects, features, and advantages of the present invention will become more fully apparent from the following detailed description, the appended claims, and the accompanying drawings in which:

FIG. 1A shows the order in which the 64 different symbols occurring twice in each frame of un-interleaved forward-link Sync data are arranged in a matrix of 16 rows and 8 columns during the interleaving operation in a cdmaOne base station;

FIG. 1B shows the order in which the 64 different symbols occurring twice in each frame as shown in the matrix of FIG. 1A are to be read in order to form a frame of interleaved forward-link Sync data.

DETAILED DESCRIPTION

Figure 2:
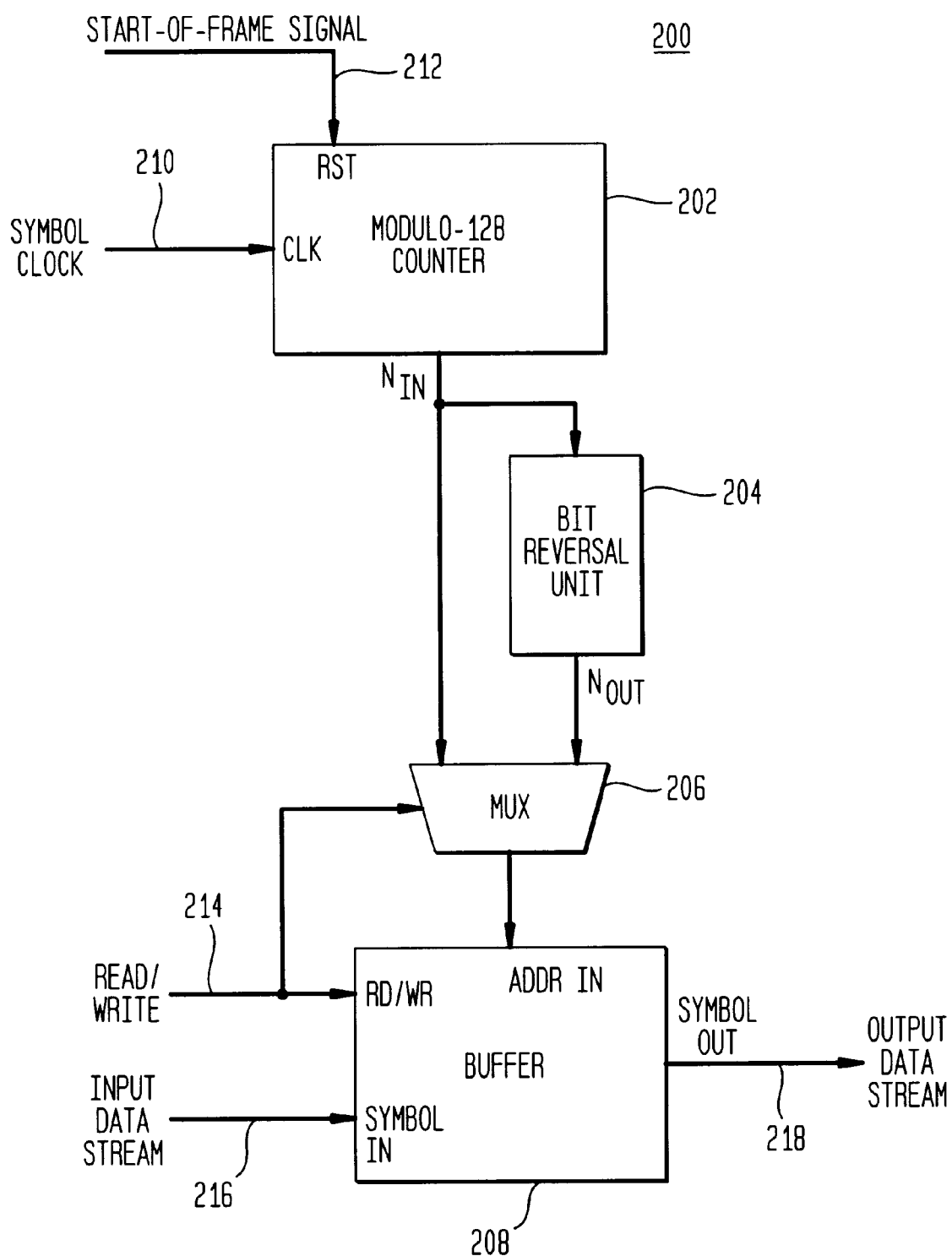
FIG. 2 shows a block diagram of an address generation unit for a cdmaOne Sync-channel interleaver/de-interleaver, according to one possible hardware embodiment of the present invention.

According to the present invention, both the interleaving process applied by a base station in a cdmaOne telecommunication system to the forward-link stream of un-interleaved Sync symbols and the de-interleaving process applied by a cdmaOne mobile unit to the forward-link stream of interleaved Sync symbols received from a cdmaOne base station correspond to the implementation of closed-form expressions, rather than the table-based procedures of conventional cdmaOne systems. Depending on the particular embodiment, the closed-form expressions can be implemented in either hardware or software.

Closed-Form Expression for Sync-Channel Interleaving Process

This section presents the closed-form expression that relates the symbol positions in the un-interleaved stream to the symbol positions in the interleaved stream for the forward-link Sync channel transmitted from the base stations to the mobile units of a cdmaOne telecommunication system. If $N_{IN}$ represents the symbol position in the un-interleaved stream and $N_{OUT}$ represents the symbol position in the interleaved stream, then a closed-form expression may be presented as follows:

$$N_{OUT}=F(N_{IN}) \quad (1)$$

where F( ) represents the operations applied to the un-interleaved symbol position $N_{IN}$ to generate the interleaved symbol position $N_{OUT}$. The interleaved symbol position $N_{OUT}$ can be thought of as a buffer address for the interleaved symbol stream.

Figures 1A, 1B:
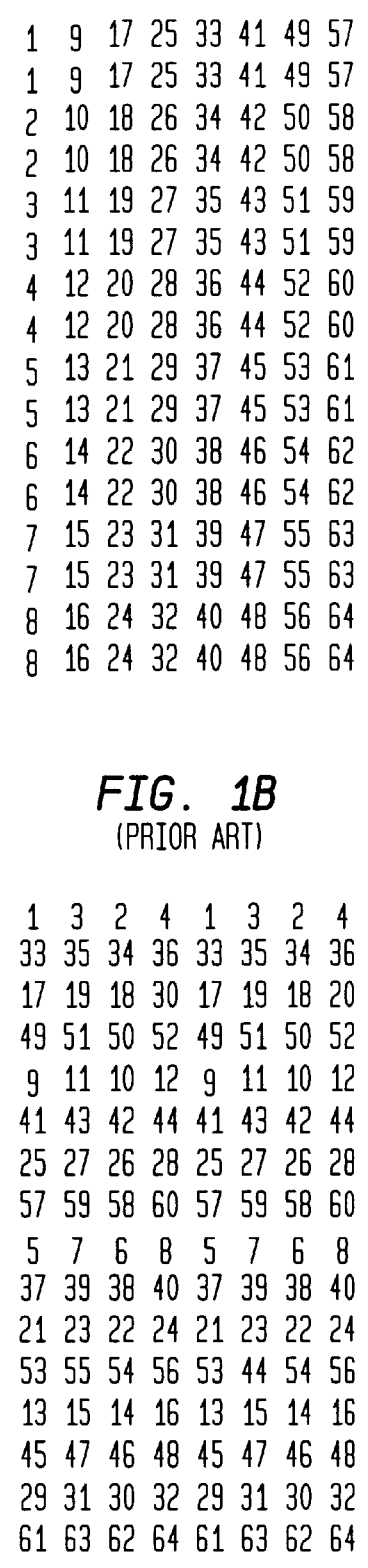

For each Sync frame, the 128 symbols in the un-interleaved signal stream (e.g., as in FIG. 1A) are counted sequentially from $N_{IN}$ equals 0 to 127. As such, $N_{IN}$ can be represented by the 7-tuple $(c_6,c_5,c_4,c_3,c_2,c_1,c_0)$, where:

$$N_{IN}=2^6c_6+2^5c_5+2^4c_4+2^3c_3+2^2c_2+2c_1+c_0. \quad (2)$$

The interleaved symbol position $N_{OUT}$ is given by the 7-tuple $(c_0, c_1, c_2, c_3, c_4, c_5, c_6)$, which is equivalent to Equation (3) as follows:

$$N_{OUT}=2^6c_0+2^5c_1+2^4c_2+2^3c_3+2^2c_4+2c_5+c_6. \quad (3)$$

In other words, the most significant bit (MSB) of the un-interleaved symbol position $N_{IN}$ becomes the least significant bit (LSB) of the interleaved symbol position $N_{OUT}$, the second MSB of $N_{IN}$ becomes the second LSB of $N_{OUT}$, and so on until the LSB of the $N_{IN}$ becomes the MSB of $N_{OUT}$.

Equation (3) is a closed-form expression corresponding to the interleaving process applied by a base station to the un-interleaved symbol stream of the forward-link Sync channel in a cdmaOne telecommunication system. This closed-form expression can be implemented in either hardware or software or even a combination of hardware and software.

Closed-Form Expression for Sync-Channel De-Interleaving Process

This section presents the closed-form expression that relates the symbol positions in the interleaved stream to the symbol positions in the de-interleaved stream for the forward-link Sync channel received by the mobile units from the base stations of a cdmaOne telecommunication system. If $N_{IN}$ represents the symbol position in the interleaved stream and $N_{OUT}$ represents the symbol position in the de-interleaved stream, then a closed-form expression may be presented as follows:

$$N_{OUT}=G(N_{IN}) \quad (4)$$

where G( ) represents the operations applied to the interleaved symbol position $N_{IN}$ to generate the de-interleaved symbol position $N_{OUT}$. The de-interleaved symbol position $N_{OUT}$ can be thought of as a buffer address for the de-interleaved symbol stream.

For each Sync frame, the 128 symbols in the interleaved signal stream (e.g., as in FIG. 1B) are counted sequentially from $N_{IN}$ equals 0 to 127. As such, $N_{IN}$ can be represented by the 7-tuple $(c_6,c_5,c_4,c_3,c_2,c_1,c_0)$, where:

$$N_{IN}=2^6c_6+2^5c_5+2^4c_4+2^3c_3+2^2c_2+2c_1+c_0. \quad (5)$$

The de-interleaved symbol position $N_{OUT}$ is given by the 7-tuple $(c_0, c_1, c_2, C_3, C_4, C_5, c_6)$, which is equivalent to Equation (6) as follows:

$$N_{OUT}=2^6c_0+2^5c_1+2^4c_2+2^3c_3+2^2c_4+2c_5+c_6. \quad (6)$$

In other words, the most significant bit (MSB) of the interleaved symbol position $N_{IN}$ becomes the least significant bit (LSB) of the de-interleaved symbol position $N_{OUT}$, the second MSB of $N_{IN}$ becomes the second LSB of $N_{OUT}$, ..., and the LSB of the $N_{IN}$ becomes the MSB of $N_{OUT}$.

Equation (6) is a closed-form expression corresponding to the de-interleaving process applied by a mobile unit to the interleaved symbol stream of the forward-link Sync channel in a cdmaOne telecommunication system. This closed-form expression can be implemented in either hardware or software or even a combination of hardware and software.

Since the closed-form expression of Equation (3) for the forward-link Sync-channel interleaving process is identical to the closed-form expression of Equation (6) for the forward-link Sync-channel de-interleaving process, the same hardware and/or software implementations can be used in both cdmaOne base stations for the interleaving process and cdmaOne mobile units for the de-interleaving process.

Hardware Implementation

In one possible hardware implementation of the present invention, the same design can be used for both the forward-link Sync-channel interleaver in a cdmaOne base station and the forward-link Sync-channel de-interleaver in a cdmaOne mobile unit. According to this design, a cdmaOne Sync-channel interleaver/de-interleaver comprises an address generation unit and a symbol buffer. The symbol buffer contains a maximum of 128 symbols corresponding to a Sync-channel frame. Each symbol is either written into or read from the symbol buffer at the address indicated by the output of the address generation unit (i.e., $N_{OUT}$).

FIG. 2 shows a block diagram of an address generation unit 200 and symbol buffer 208 for a cdmaOne forward-link Sync-channel interleaver/de-interleaver, according to one possible hardware embodiment of the present invention. Address generation unit 200 receives a clock signal corresponding to the symbol position $N_{IN}$ for the current symbol in the current frame of the input data stream (i.e., un-interleaved data for the interleaving process and interleaved data for the de-interleaving process) and generates the appropriate corresponding symbol position $N_{OUT}$ for the output data stream (i.e., interleaved data for the interleaving process and de-interleaved data for the de-interleaving process), which is used as the address for writing the symbol to or reading the symbol from symbol buffer 208.

When used for Sync-channel interleaving, address generation unit 200 of FIG. 2 can be used to generate symbol buffer addresses to write data into buffer locations corresponding to the interleaved sequence shown in FIG. 1B. In that case, after the buffer is filled, the interleaved data can be read sequentially from the memory for subsequent processing. This is an example of what is referred to as write-interleave-read-linear processing. Those skilled in the art will understand that address generation unit 200 of FIG. 2 can also be used to perform write-linear-read-interleave processing, in which the un-interleaved data is written linearly into a symbol buffer (as in FIG. 1A) and then read from the buffer using the buffer addresses generated by address generation unit 200 to yield the interleaved symbol stream for subsequent processing.

Analogously, when used for Sync-channel de-interleaving, address generation unit 200 of FIG. 2 can be used to generate symbol buffer addresses to write data into buffer locations corresponding to the de-interleaved sequence shown in FIG. 1A. In that case, after the buffer is filled, the de-interleaved data can be read sequentially from the memory for subsequent processing. This is an example of what is referred to as write-de-interleave-read-linear processing. Those skilled in the art will understand that address generation unit 200 of FIG. 2 can also be used to perform write-linear-read-de-interleave processing, in which the interleaved data is written linearly into a symbol buffer (to yield FIG. 1B) and then read from the buffer using the buffer addresses generated by address generation unit 200 to yield the de-interleaved symbol stream for subsequent processing.

In one possible implementation, address generation unit 200 has a modulo-128 counter 202, a bit reversal unit 204, and a two-input mux 206. The symbol clock 210 is synchronized with the start-of-frame signal 212, with the counter being reset to zero at the start of each Sync-channel frame. The 7-bit output $N_{IN}$ of modulo-128 counter 202 feeds both bit reversal unit 204 and one of the data inputs to mux 206. Bit reversal unit 204 reverses the order of $N_{IN}$ to generate $N_{OUT}$, as in Equations (3) and (6), which is the second data input to mux 206.

Although counter 202 is shown in FIG. 2 as being reset at the start of each frame, in general, the counter need only be reset at the start of the first frame and again at any other event that may require synchronization.

Although counter 202 is shown in FIG. 2 as a modulo-128 counter, since the start-of-frame signal is used as a reset signal for counter 202, counter 202 could be implemented as a "modulo-129" or higher counter instead of a modulo-128 counter. In general, the term "modulo-128 counter" as used in this specification may be interpreted as referring to any modulo-128 or higher counter, with the 7 LSBs of the counter output used to generate the address.

Read/write control signal 214 controls which input to mux 206 is presented as the data output from mux 206. The output from mux 206 is used as the buffer address when writing data 216 to or reading data 218 from symbol buffer 208. When used for Sync-channel interleaving, write-interleave-read-linear processing is accomplished by using $N_{OUT}$ as the buffer address when un-interleaved data 216 is written to symbol buffer 208 and using $N_{IN}$ as the buffer address when interleaved data 218 is read from symbol buffer 208. Alternatively, when used for Sync-channel interleaving, write-linear-read-interleave processing is accomplished by using $N_{IN}$ as the buffer address when un-interleaved data 216 is written to symbol buffer 208 and using $N_{OUT}$ as the buffer address when interleaved data 218 is read from symbol buffer 208.

Analogously, when used for Sync-channel de-interleaving, write-de-interleave-read-linear processing is accomplished by using $N_{OUT}$ as the buffer address when interleaved data 216 is written to symbol buffer 208 and using $N_{IN}$ as the buffer address when de-interleaved data 218 is read from symbol buffer 208. Alternatively, when used for Sync-channel de-interleaving, write-linear-read-de-interleave processing is accomplished by using $N_{IN}$ as the buffer address when interleaved data 216 is written to symbol buffer 208 and using $N_{OUT}$ as the buffer address when de-interleaved data 218 is read from symbol buffer 208.

Although the present invention has been described in the context of one possible hardware implementation, it will be understood that other alternative hardware implementations corresponding to the closed-form expressions of Equations (3) and (6) are also possible. Moreover, hardware embodiments can be implemented as part of an integrated circuit that also performs other base-station or mobile-unit functions. In addition, the expressions can be implemented in software or in a combination of hardware and software, as appropriate. Even if implemented entirely in software, embodiments corresponding to the closed-form expressions of Equations (3) and (6) are simpler than the table-based algorithms of existing systems.

Although the present invention has been explained in the context of cdmaOne communication systems, it will be understood that the present invention can also be implemented in the context of communication systems conforming to standards other than the cdmaOne family of communication standards.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method for interleaving/de-interleaving a forward-line Sync channel of a communication system, comprising the steps of:
   (a) receiving an input symbol stream for the forward-link Sync channel;
   (b) implementing a closed-form expression relating each input symbol position to an output symbol position to generate the output symbol position for each symbol in the input symbol stream, wherein the closed-form expression corresponds to two or more different sets of mathematical operations being applied to bits in a binary value representing each input symbol position to generate bits in a binary value representing a corresponding output symbol position; and
   (c) generating an output symbol stream from the input symbol stream using the generated output symbol positions, wherein:
      when interleaving, the input symbol stream is an un-interleaved symbol stream and the output symbol stream is an interleaved symbol stream; and
      when de-interleaving, the input symbol stream is an interleaved symbol stream and the output symbol stream is a de-interleaved symbol stream.

2. The method of claim 1, wherein: the closed-form expression is given by:

$$N_{OUT}=2^6c_0+2^5c_1+2^4c_2+2^3c_3+2^2c_4+2c_5+c_6$$

wherein:
   $N_{IN}$ is the input symbol position, an integer ranging from 0 to 127 represented by a 7-tuple ($c_6$, $c_5$, $c_4$, $c_3$, $c_2$, $c_1$, $c_0$), where each element $c_{0-6}$ is an integer ranging from 0 to 1; and
   $N_{OUT}$ is the output symbol position, an integer ranging from 0 to 127.

3. The method of claim 2, wherein the closed-form expression is implemented in software.

4. The method of claim 2, wherein the closed-form expression is implemented in hardware.

5. The method of claim 4, wherein the closed-form expression is implemented in a single integrated circuit.

6. The method of claim 5, wherein the hardware implementation comprises:
   (1) a modulo-128 or higher counter adapted to generate the 7-tuple ($c_6$, $c_5$, $c_4$, $c_3$, $c_2$, $c_1$, $c_0$) for the input symbol position; and
   (2) a bit reversal unit adapted to generate the 7-tuple ($c_0$, $c_1$, $c_2$, $c_3$, $c_4$, $c_5$, $c_6$) for the output symbol position from the input symbol position.

7. The method of claim 6, wherein the hardware implementation further comprises a two-input mux adapted to receive the input symbol position, the output symbol position, and a control signal that determines whether the input symbol position or the output symbol position is presented at the output of the mux.

8. An apparatus for interleaving/de-interleaving a forward-link Sync channel of a communication system, comprising:
   (a) means for receiving an input symbol stream for the forward-link Sync channel;
   (b) means for implementing a closed-form expression relating each input symbol position to an output symbol position to generate the output symbol position for each symbol in the input symbol stream, wherein the closed-form expression corresponds to two or more different sets of mathematical operations being applied to bits in a binary value representing each input symbol position to generate bits in a binary value representing a corresponding output symbol position; and
   (c) means for generating an output symbol stream from the input symbol stream using the output symbol positions, wherein:
      when interleaving, the input symbol stream is an un-interleaved symbol stream and the output symbol stream is an interleaved symbol stream; and
      when de-interleaving, the input symbol stream is an interleaved symbol stream and the output symbol stream is a de-interleaved symbol stream.

9. The apparatus of claim 8, wherein: the closed-form expression is given by:

$$N_{OUT}=2^6c_0+2^5c_1+2^4c_2+2^3c_3+2^2c_4+2c_5+c_6$$

wherein:
   $N_{IN}$ is the input symbol position, an integer ranging from 0 to 127 represented by a 7-tuple ($c_6$, $c_5$, $c_4$, $c_3$, $c_2$, $c_1$, $c_0$), where each element $c_{0-6}$ is an integer ranging from 0 to 1; and
   $N_{OUT}$ is the output symbol position, an integer ranging from 0 to 127.

10. The apparatus of claim 9, wherein the closed-form expression is implemented in software.

11. The apparatus of claim 9, wherein the closed-form expression is implemented in hardware.

12. The apparatus of claim 11, wherein the closed-form expression is implemented in a single integrated circuit.

13. The apparatus of claim 12, wherein the hardware implementation comprises:
   (1) a modulo-128 or higher counter adapted to generate the 7-tuple ($c_6$, $c_5$, $c_4$, $c_3$, $c_2$, $c_1$, $c_0$) for the input symbol position; and
   (2) a bit reversal unit adapted to generate the 7-tuple ($c_0$, $c_1$, $c_2$, $c_3$, $c_4$, $c_5$, $c_6$) for the output symbol position from the input symbol position.

14. The apparatus of claim 13, wherein the hardware implementation further comprises a two-input mux adapted to receive the input symbol position, the output symbol position, and a control signal that determines whether the input symbol position or the output symbol position is presented at the output of the mux.

15. An integrated circuit having an interleaver/de-interleaver for processing a forward-link Sync channel of a communication system, wherein the interleaver/de-interleaver comprises:
   (A) a symbol buffer; and
   (B) an address generation unit adapted to generate symbol addresses for reading data from or writing data to the symbol buffer, wherein the address generation unit implements a closed-form expression relating each input symbol position of an input symbol stream to an output symbol position of an output symbol stream to generate the output symbol position for each symbol in the input symbol stream, wherein the closed-form expression corresponds to two or more different sets of mathematical operations being applied to bits in a binary value representing each input symbol position to generate bits in a binary value representing a corresponding output symbol position, wherein:

when interleaving, the input symbol stream is an un-interleaved symbol stream and the output symbol stream is an interleaved symbol stream; and when de-interleaving, the input symbol stream is an interleaved symbol stream and the output symbol stream is a de-interleaved symbol stream.

16. The integrated circuit of claim 15, wherein: the closed-form expression is given by:

$$N_{OUT}=2^6c_0+2^5c_1+2^4c_2+2^3c_3+2^2c_4+2c_5+c_6$$

wherein:

$N_{IN}$ is the input symbol position, an integer ranging from 0 to 127 represented by the 7-tuple ($c_6, c_5, c_4, c_3, c_2, c_1, c_0$), where each element $c_{0-6}$ is an integer ranging from 0 to 1; and $N_{OUT}$ is the output symbol position an integer ranging from 0 to 127.

17. The integrated circuit of claim 16, wherein the address generation unit comprises:

(1) a modulo-128 or higher counter adapted to generate a 7-tuple ($c_6, c_5, c_4, c_3, c_2, c_1, c_0$) for the input symbol position; and (2) a bit reversal unit adapted to generate the 7-tuple ($c_0, c_1, c_2, c_3, c_4, c_5, c_6$) for the output symbol position from the input symbol position.

18. The integrated circuit of claim 17, wherein the address generation unit further comprises a two-input mux adapted to receive the input symbol position, the output symbol position, and a control signal that determines whether the input symbol position or the output symbol position is presented at the output of the mux.

19. The method of claim 1, wherein the closed-form expression is implementable without relying on any lookup tables.

20. The apparatus of claim 8, wherein the closed-form expression is implementable without relying on any lookup tables.

21. The integrated circuit of claim 15, wherein the closed-form expression is implementable without relying on any lookup tables.

* * * * *